(12) United States Patent
Lee et al.

(10) Patent No.: US 8,198,914 B2
(45) Date of Patent: Jun. 12, 2012

(54) APPARATUS AND METHODS FOR ADJUSTING PERFORMANCE OF PROGRAMMABLE LOGIC DEVICES

(75) Inventors: Andy L. Lee, San Jose, CA (US); Christopher F. Lane, San Jose, CA (US); Ketan H. Zaveri, San Jose, CA (US); Richard G. Cliff, Los Altos, CA (US); Cameron R. McClintock, Mountain View, CA (US); Srinivas T. Reddy, Fremont, CA (US); David Lewis, Toronto (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/098,450

(22) Filed: Apr. 30, 2011

(65) Prior Publication Data

US 2011/0204919 A1 Aug. 25, 2011

Related U.S. Application Data

(62) Division of application No. 11/361,642, filed on Feb. 24, 2006, now Pat. No. 7,936,184.

(51) Int. Cl.
*H01L 25/00* (2006.01)

(52) U.S. Cl. .......................................... 326/41; 326/38

(58) Field of Classification Search .................. None
See application file for complete search history.

(56) References Cited

U.S. PATENT DOCUMENTS

| | | | |
|---|---|---|---|
| 5,661,685 A * | 8/1997 | Lee et al. | 365/185.22 |
| 6,366,128 B1 * | 4/2002 | Ghia et al. | 326/83 |
| 6,429,726 B1 * | 8/2002 | Bruneau et al. | 327/537 |
| 6,583,646 B1 * | 6/2003 | Patel et al. | 326/80 |
| 6,744,301 B1 * | 6/2004 | Tschanz et al. | 327/534 |
| 6,777,978 B2 * | 8/2004 | Hart et al. | 326/38 |
| 7,002,397 B2 * | 2/2006 | Kubo et al. | 327/534 |
| 7,112,997 B1 * | 9/2006 | Liang et al. | 326/81 |
| 7,129,745 B2 * | 10/2006 | Lewis et al. | 326/38 |
| 7,548,091 B1 * | 6/2009 | Liu | 326/40 |
| 7,986,160 B2 * | 7/2011 | Hoang et al. | 326/30 |
| 2002/0030533 A1 * | 3/2002 | De et al. | 327/534 |
| 2002/0079951 A1 * | 6/2002 | Borkar et al. | 327/534 |

* cited by examiner

*Primary Examiner* — Shawki S Ismail
*Assistant Examiner* — Crystal L Hammond
(74) *Attorney, Agent, or Firm* — Law Offices of Maximilian R. Peterson

(57) ABSTRACT

A programmable logic device (PLD) includes at least two regions. Each region includes electrical circuitry that has a set of transistors. Each of the two regions has a corresponding fixed transistor threshold voltage, a corresponding fixed transistor body bias, and a corresponding fixed supply voltage.

20 Claims, 13 Drawing Sheets

APPARATUS AND METHODS FOR ADJUSTING PERFORMANCE OF PROGRAMMABLE LOGIC DEVICES

CROSS-REFERENCE TO RELATED APPLICATIONS

This application is a divisional application of, and incorporates by reference, U.S. patent application Ser. No. 11/361,642, filed on Feb. 24, 2006, now U.S. Pat. No. 7,936,184 titled 'Apparatus and methods for adjusting performance of programmable logic devices,' U.S. Pat. No. 7,936,184.

TECHNICAL FIELD

The inventive concepts relate generally to adjusting the performance of programmable logic devices (PLDs) and, more particularly, to using in PLDs regions or resources with fixed performance characteristics, such as threshold voltage, body bias, and/or supply voltage(s).

BACKGROUND

PLDs are flexible electronic devices that allow users to change or program the functionality of the device as desired. To accommodate the users' increasingly complex designs, modern PLDs include a relatively large number of transistors. At 90 nm process technologies and beyond, power consumption, power dissipation, die temperatures and, hence, power density (power dissipation in various circuits or blocks), of PLDs has become an increasingly important issue.

As transistor threshold voltages have scaled to maintain speed advantages over the previous process node, the transistors have exhibited higher sub-threshold leakage. The DC leakage problem is even worse for relatively large dies, as used for PLDs, because of the relatively large number of transistors. A need therefore exists for managing power consumption in PLDs.

SUMMARY

The disclosed inventive concepts relate generally to adjusting the performance of PLDs. In one exemplary embodiment, a PLD includes at least two regions, each of which includes electrical circuitry. The electrical circuitry includes a set of transistors. Each of the regions has a corresponding fixed transistor threshold voltage, a corresponding fixed transistor body bias, and a corresponding fixed supply voltage.

In another illustrative embodiment, a PLD includes a plurality of blocks of circuitry. Each block in the plurality of blocks of circuitry has a plurality of transistors, where each transistor has a fixed threshold voltage. The PLD further includes at least one body bias generator configured to provide a fixed body bias voltage to at least some of the plurality of transistors in some of blocks in the plurality of blocks of circuitry. Each block in the plurality of blocks receives power from a fixed supply voltage.

In another exemplary embodiment, an apparatus includes a package and a PLD. The package has a plurality of coupling features, such as solder bumps. The PLD includes a plurality of regions of circuitry. The plurality of coupling features of the package configurably provide a set of at least one supply voltage to the plurality of regions of circuitry of the PLD.

In yet another illustrative embodiment, a method of designing a PLD) that has programmable circuitry includes obtaining a set of parameters corresponding to an operating characteristic of the PLD. The set of parameters includes at least one fixed threshold voltage, at least one fixed body bias voltage, and at least one fixed supply voltage. The method also includes selecting a level of granularity for application of the set of parameters to at least some parts of the programmable circuitry within the PLD, and applying the obtained set of parameters to the at least some parts of the programmable circuitry corresponding to the selected level of granularity.

BRIEF DESCRIPTION OF THE DRAWINGS

The appended drawings illustrate only exemplary embodiments of the invention and therefore should not be considered as limiting its scope. Persons of ordinary skill in the art who have the benefit of the description of the invention appreciate that the disclosed inventive concepts lend themselves to other equally effective embodiments. In the drawings, the same numeral designators used in more than one drawing denote the same, similar, or equivalent functionality, components, or blocks.

DETAILED DESCRIPTION

The inventive concepts contemplate apparatus and associated methods for managing the power consumption and performance of PLDs. More specifically, the invention concerns separate regions or resources in a PLD that operate at different speed-leakage or speed-power consumption operating points or characteristics. In exemplary embodiments, the PLD includes such regions or resources with hard-implemented or hard-encoded characteristics. In other embodiments, the PLD may combine hard-implemented features with soft-implemented or dynamic speed-leakage or speed-power consumption operating points or characteristics, as desired.

Figures 1, 3:
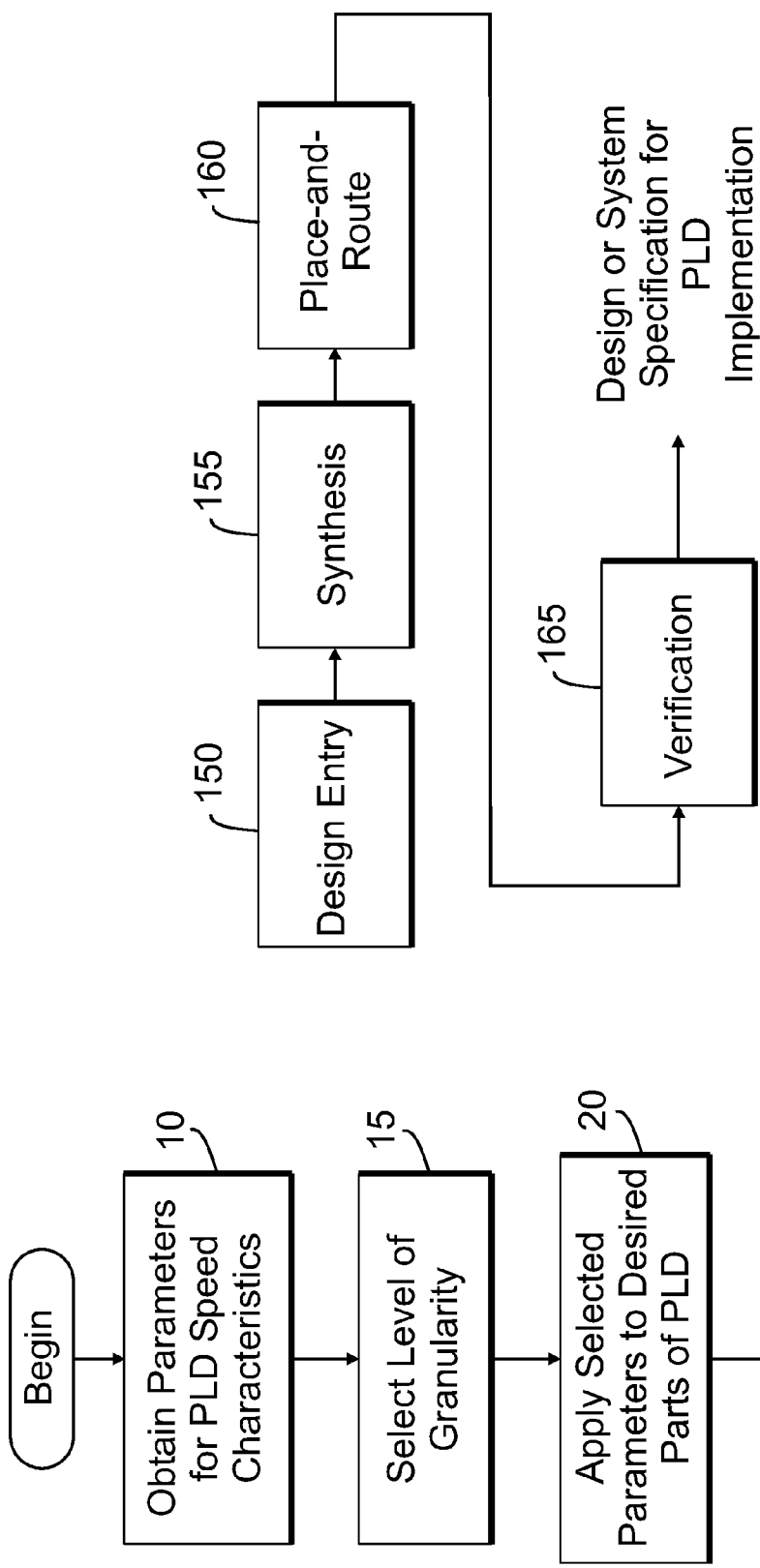
FIG. 1 illustrates a simplified flow diagram for designing a PLD according to exemplary embodiments of the invention.
FIG. 3 depicts a conceptual flow diagram for a computer-aided design (CAD) software used in exemplary embodiments of the invention.

FIG. 1 shows a simplified flow diagram for designing a PLD according to exemplary embodiments of the invention. At 10, one obtains parameters for PLD speed or operating or performance characteristics and, hence, power consumption or leakage. The characteristics may be in the form of design or performance specifications or other formats, as desired, and as persons of ordinary skill in the art who have the benefit of the description of the invention understand.

As described below in detail, the characteristics may specify one of more of transistor threshold voltages, transistor body biases, and supply voltage(s). Furthermore, each of those characteristics may apply with a desired level of granularity to circuitry within the PLD, for example, to some or all of various blocks, regions, or circuits within the PLD (described below), for example, programmable circuitry within the PLD.

At 15, one selects the desired level of granularity for each desired characteristic. The level of granularity corresponds to application of the set of parameters to some or all of the circuits, regions, or blocks in the PLD (e.g., programmable circuitry). Generally, the level of granularity might apply to any desired resource or region on the PLD. For example, it might range from single transistors, to groups or blocks of transistors, to circuit blocks or regions of the PLD, to quadrants or halves of the PLD, or to the entire PLD, as desired, and as persons of ordinary skill in the art who have the benefit of the description of the invention understand.

At 20, one applies the selected parameters to the desired resources or regions of the PLD. Thus, with a desired level of granularity, one may design various regions or resources of the PLD with a desired or specified threshold voltage, body bias, and/or supply voltage. Put another way, one applies the obtained parameters to the at least some parts of the circuitry, blocks, or regions corresponding to the selected level of granularity.

Figure 2:
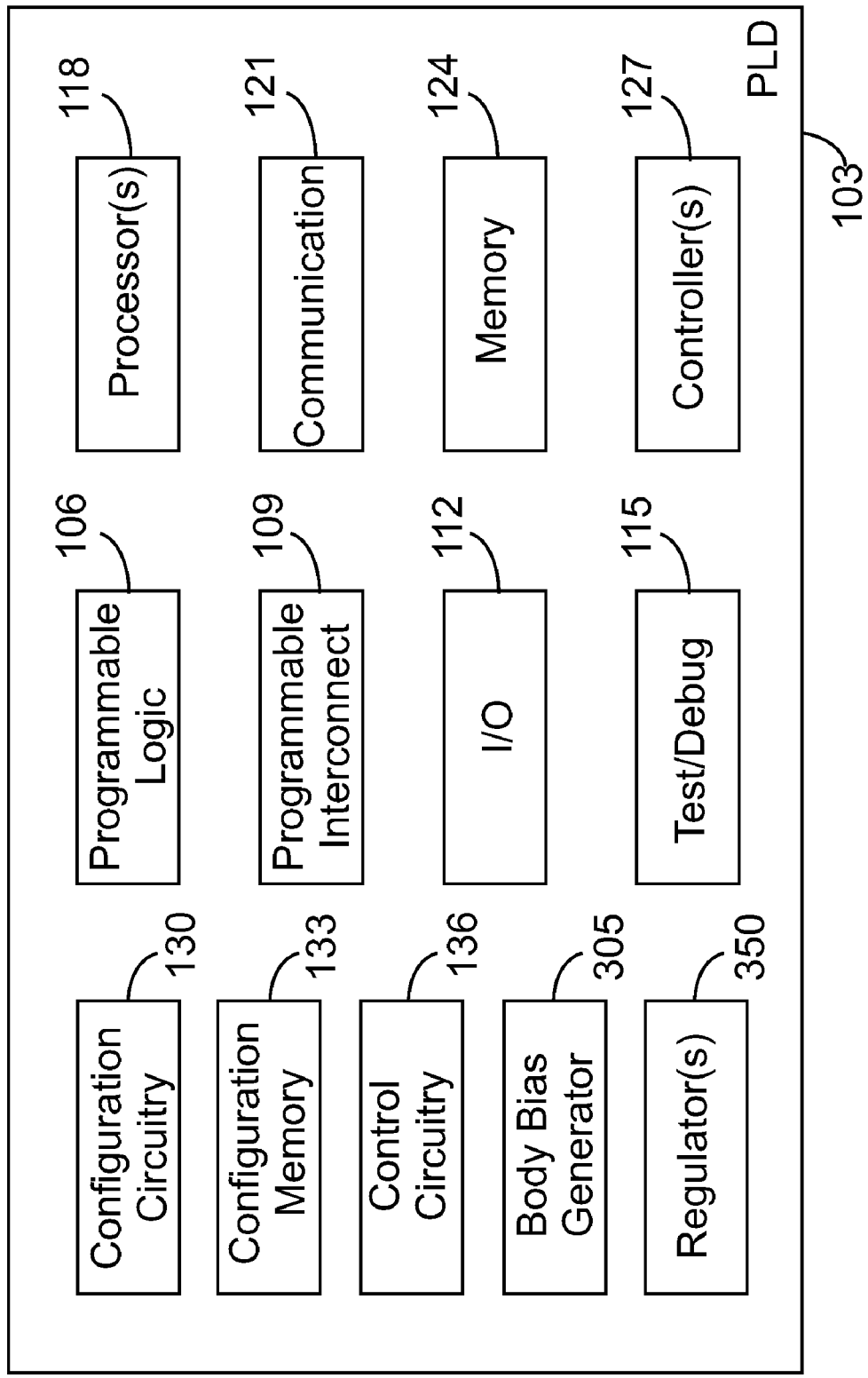
FIG. 2 shows a general block diagram of a PLD according to an illustrative embodiment of the invention.

As noted, one might apply the design methodology and inventive concepts described here to any resource or region of a PLD. FIG. 2 shows a general block diagram of a PLD 103 according to an illustrative embodiment of the invention. PLD 103 includes configuration circuitry 130, configuration memory (CRAM) 133, control circuitry 136, programmable logic 106, programmable interconnect 109, and I/O circuitry 112. In addition, PLD 103 may include test/debug circuitry 115, one or more processors 118, one or more communication circuitry 121, one or more memories 124, one or more controllers 127, as desired.

PLD 103 may further include body bias generator(s) 305 and regulator(s) 350. Body bias generator(s) 305 provide a mechanism for supplying body bias to some or all of the transistors in PLD 103, as described below in detail. Regulator(s) 350 provide a mechanism for generating supply voltages, as described below in detail.

Note that FIG. 2 shows a simplified block diagram of PLD 103. Thus, PLD 103 may include other blocks and circuitry, as persons of ordinary skill in the art understand. Examples of such circuitry include clock generation and distribution circuits, redundancy circuits, and the like. Furthermore, PLD 103 may include, analog circuitry, other digital circuitry, and/or mixed-mode circuitry, as desired. One may the design methodology and inventive concepts described here to any of the resources, blocks, or circuits of PLD 103, as desired. Furthermore, one may apply the methodology and concepts to other PLD architectures, including any desired blocks, regions, or circuits, as persons of ordinary skill in the art who have the benefit of the description of the invention understand.

Programmable logic 106 includes blocks of configurable or programmable logic circuitry, such as look-up tables (LUTs), product-term logic, multiplexers (MUXs), logic gates, registers, memory, and the like. Programmable interconnect 109 couples to programmable logic 106 and provides configurable interconnects (coupling mechanisms) between various blocks within programmable logic 106 and other circuitry within or outside PLD 103.

Control circuitry 136 controls various operations within PLD 103, including aspects of the inventive concepts. Under the supervision of control circuitry 136, PLD configuration circuitry 130 uses configuration data (which it obtains from an external source, such as a storage device, a host, etc.) to program or configure the functionality of PLD 103. Configuration data are typically used to store information in CRAM 133. The contents of CRAM 133 determine the functionality of various blocks of PLD 103, such as programmable logic 106 and programmable interconnect 109.

I/O circuitry 112 may constitute a wide variety of I/O devices or circuits, as persons of ordinary skill in the art who have the benefit of the description of the invention understand. I/O circuitry 112 may couple to various parts of PLD 103, for example, programmable logic 106 and programmable interconnect 109. I/O circuitry 112 provides a mechanism and circuitry for various blocks within PLD 103 to communicate with external circuitry or devices.

Test/debug circuitry 115 facilitates the testing and troubleshooting of various blocks and circuits within PLD 103. Test/debug circuitry 115 may include a variety of blocks or circuits known to persons of ordinary skill in the art who have the benefit of the description of the invention. For example, test/debug circuitry 115 may include circuits for performing tests after PLD 103 powers up or resets, as desired. Test/debug circuitry 115 may also include coding and parity circuits, as desired.

PLD 103 may include one or more processors 118. Processor 118 may couple to other blocks and circuits within PLD 103. Processor 118 may receive data and information from circuits within or external to PLD 103 and process the information in a wide variety of ways, as persons skilled in the art with the benefit of the description of the invention appreciate. One or more of processor(s) 118 may constitute a digital signal processor (DSP). DSPs allow performing a wide variety of signal processing tasks, such as compression, decompression, audio processing, video processing, filtering, and the like, as desired.

PLD 103 may also include one or more communication circuits 121. Communication circuit(s) 121 may facilitate data and information exchange between various circuits within PLD 103 and circuits external to PLD 103, as persons of ordinary skill in the art who have the benefit of the description of the invention understand.

PLD 103 may further include one or more memories 124 and one or more controller(s) 127. Memory 124 allows the storage of various data and information (such as user-data, intermediate results, calculation results, etc.) within PLD 103. Memory 124 may have a granular or block form, as desired. Controller 127 allows interfacing to, and controlling the operation and various functions of circuitry outside the PLD. For example, controller 127 may constitute a memory controller that interfaces to and controls an external synchronous dynamic random access memory (SDRAM), as desired.

Note that, in exemplary embodiments, PLD 103 may further include one or more on-chip regulator(s) 350, such as voltage regulators, as desired. Such regulator(s) may provide one or more fixed or variable or programmable output voltages for internal use of PLD 103, as desired. Fixed output voltage(s) of on-chip regulator(s) avoid the user's having to use additional external power supplies or voltage regulators, as persons of ordinary skill in the art who have the benefit of the description of the invention understand.

As described below in detail, the inventive concepts take advantage of the fact that a relatively large proportion of PLD resources might end up unused or partly used. By using software CAD, the disclosed techniques and apparatus map a user's design to the PLD's resources so as to take advantage of level of utilization of the PLD's resources. FIG. 3 illustrates a simplified diagram of various software modules or blocks that PLD CAD software used in illustrative embodiments of the invention. They include design-entry module 150, synthesis module 155, place-and-route module 160, and verification module 165. The following description provides a simplified explanation of the operation of each module, followed by a description of methods relating to various aspects of power management according to the invention.

Design-entry module 150 allows the editing of various design description files using graphical or textual descriptions of a circuit or its behavior, such as schematics, hardware description languages (HDL), or waveforms, as desired. The user may generate the design files by using design-entry module 150 or by using a variety of electronic design automation (EDA) or CAD tools (such as industry-standard EDA tools), as desired. The user may enter the design in a graphic format, a waveform-based format, a schematic format, in a text or binary format, or as a combination of those formats, as desired.

Synthesis module 155 accepts the output of design-entry module 150. Based on the user-provided design, synthesis module 155 generates appropriate logic circuitry that realizes the user-provided design. One or more PLDs (not shown explicitly) implement the synthesized overall design or system. Synthesis module 155 may also generate any glue logic that allows integration and proper operation and interfacing of various modules in the user's designs. For example, synthesis module 155 provides appropriate hardware so that an output of one block properly interfaces with an input of another block. Synthesis module 155 may provide appropriate hardware so as to meet the specifications of each of the modules in the overall design or system.

Furthermore, synthesis module 155 may include algorithms and routines for optimizing the synthesized design. Through optimization, synthesis module 155 seeks to more efficiently use the resources of the one or more PLDs that implement the overall design or system. Synthesis module 155 provides its output to place-and-route module 160.

Place-and-route module 160 uses the designer's timing specifications to perform optimal logic mapping and placement. The logic mapping and placement determine the use of routing resources within the PLD(s). In other words, by use of particular programmable interconnects with the PLD(s) for certain parts of the design, place-and-route module 160 helps optimize the performance of the overall design or system. By proper use of PLD routing resources, place-and-route module 160 helps to meet the critical timing paths of the overall design or system.

Place-and-route module 160 optimizes the critical timing paths to help provide timing closure faster in a manner known to persons of ordinary skill in the art with the benefit of the description of the invention. As a result, the overall design or system can achieve faster performance (i.e., operate at a higher clock rate or have higher throughput). Place-and-route module 160 may use information about critical paths within the design or system to adjust power consumption of parts or all of the design or system, as desired.

Verification module 165 performs simulation and verification of the design. The simulation and verification seek in part to verify that the design complies with the user's prescribed specifications. The simulation and verification also aim at detecting and correcting any design problems before prototyping the design. Thus, verification module 165 helps the user to reduce the overall cost and time-to-market of the overall design or system.

Verification module 165 may support and perform a variety of verification and simulation options, as desired. The options may include functional verification, test-bench generation, static timing analysis, timing simulation, hardware/software simulation, in-system verification, board-level timing analysis, signal integrity analysis and electro-magnetic compatibility (EMC), formal netlist verification, and power-consumption estimation, as desired. Note that one may perform other or additional verification techniques as desired and as persons of ordinary skill in the art who have the benefit of the description of the invention understand. Verification of the design may also be performed at other phases in the flow, as appropriate, and as desired.

As noted above, the designer may, with a desired level of granularity, adjust, configure, or set several characteristics of part or all of the PLD's circuitry, i.e., the threshold voltage, the body bias, and the supply voltage(s). For metal oxide semiconductor (MOS) transistors, the threshold voltage and the body bias depend on a number of factors, as described below.

The drain current of the MOS transistor in the saturation region of operation depends on the threshold voltage and the gate-to-source voltage of the transistor:

$$i_D = K(v_{GS} - V_T)^2, \qquad (1)$$

where
 $i_D$=the total drain current,
 K=a constant,
 $v_{GS}$=the total gate-to-source voltage,
and
 $V_T$=the threshold voltage.

The threshold voltage, $V_T$, depends on a number of factors, such as the voltage between its source and body. The following equation provides the threshold voltage as a function of the body-to-source voltage:

$$V_T = V_{T(0)} + \gamma \{\sqrt{2\phi_F - |v_{BS}|} - \sqrt{2\phi_F}\}. \qquad (2A)$$

Alternatively, one may write Equation 2A in terms of the source-to-body voltage:

$$V_T = V_{T(0)} + \gamma \{\sqrt{2\phi_F + |v_{BS}|} - \sqrt{2\phi_F}\}, \qquad (2B)$$

where
 $V_{T(o)}$=the threshold voltage with the source-to-body voltage (or body-to-source voltage) set to zero,
 $\gamma$=the body factor, a constant that depends on the doping levels of the body,
 $\phi_F$=a constant,
 $|v_{BS}|$=the absolute value of the total body-to-source voltage,
and
 $|v_{SB}|$=the absolute value of the total source-to-body voltage.

Note that when the body-to-source voltage, $v_{BS}$ (or source-to-body voltage, $v_{SB}$) equals zero, the threshold voltage, $V_T$, equals $V_{T(o)}$.

As Equation 2B shows, the transistor's threshold voltage depends on the doping level of its body. Furthermore, for a finite body factor, $\gamma$, the transistor's threshold voltage increases as the absolute value of the source-to-body voltage, $|v_{SB}|$, increases. Equation 1, however, indicates that for a given gate-to-source voltage an increase in the threshold voltage decreases the drain current, $i_D$, of the transistor. In other words, according to Equations 1 and 2B, for a constant gate-to-source-voltage, $v_{GS}$, an increase in the source-to-body voltage, $v_{SB}$, causes an increase in the threshold voltage, $V_T$, as does an increase in $\gamma$.

An increased threshold voltage, $V_T$, in turn causes a decrease in the quantity $(v_{GS}-V_T)$ and, consequently, a decrease in the drain current, $i_D$, of the transistor. Thus, for a constant gate-to-source-voltage, $v_{GS}$, an increase in the source-to-body voltage or body factor causes a decrease in the current-drive capability (one measure of performance) of the transistor. The decreased current-drive capability of the transistor in turn leads to slower circuit operation and, ultimately, to slower operation of the PLD that includes the transistor (and of the PLD, itself).

The power dissipation of the transistor also varies according to changes in its threshold voltage. More specifically, a smaller threshold voltage increases the OFF-state leakage current ($I_{off}$) of the transistor, and a higher threshold voltage decreases the OFF-state leakage current ($I_{off}$) of the transistor. The $I_{off}$ of the transistor affects its static (non-switching) power dissipation. In addition, a smaller threshold voltage tends to increase the dynamic or switching power dissipation of the transistor by increasing the rush-through, or crowbar, currents. Thus, changing the threshold voltage by adjusting the body bias affects the power dissipation of the MOS transistor.

Furthermore, for a given supply voltage, $V_{DD}$, an increase in the threshold voltage, $V_T$, limits the maximum voltage that the transistor can transmit when operating as a pass transistor. In other words, if the threshold voltage, $V_T$, increases to the point that it equals or exceeds the gate-to-source-voltage, $v_{GS}$, the drain current reduces to zero. Thus, a voltage applied to the source of the transistor, for example, a voltage that corresponds to a logic 1 level, fails to properly transmit to the drain of the transistor. Consequently, the transistor fails to operate reliably as a pass transistor.

As the above description shows, one may affect the performance of the MOS transistor by adjusting its body bias or its source-to-body voltage (ultimately resulting in a change in its threshold voltage), its body factor, or both. Adjusting the body bias and/or the body factor affects performance measures such as current-drive capability, speed of operation, power dissipation, etc.

In embodiments according to the invention, one may adjust the body bias of individual transistors, individual circuits or blocks within the PLD, groups of transistors or blocks, or even the entire PLD, as desired. Furthermore, one may control the body bias of individual NMOS and PMOS transistors, or the body biases of groups of NMOS and PMOS transistors, as desired.

Generally speaking, one may apply the power management techniques to any desired part, resource, block, or circuit within in a PLD. For example, with a desired level of granularity, one may apply the concepts to programmable logic 106 and programmable interconnect 109, as desired. The following description provides details and some examples.

Figure 4:
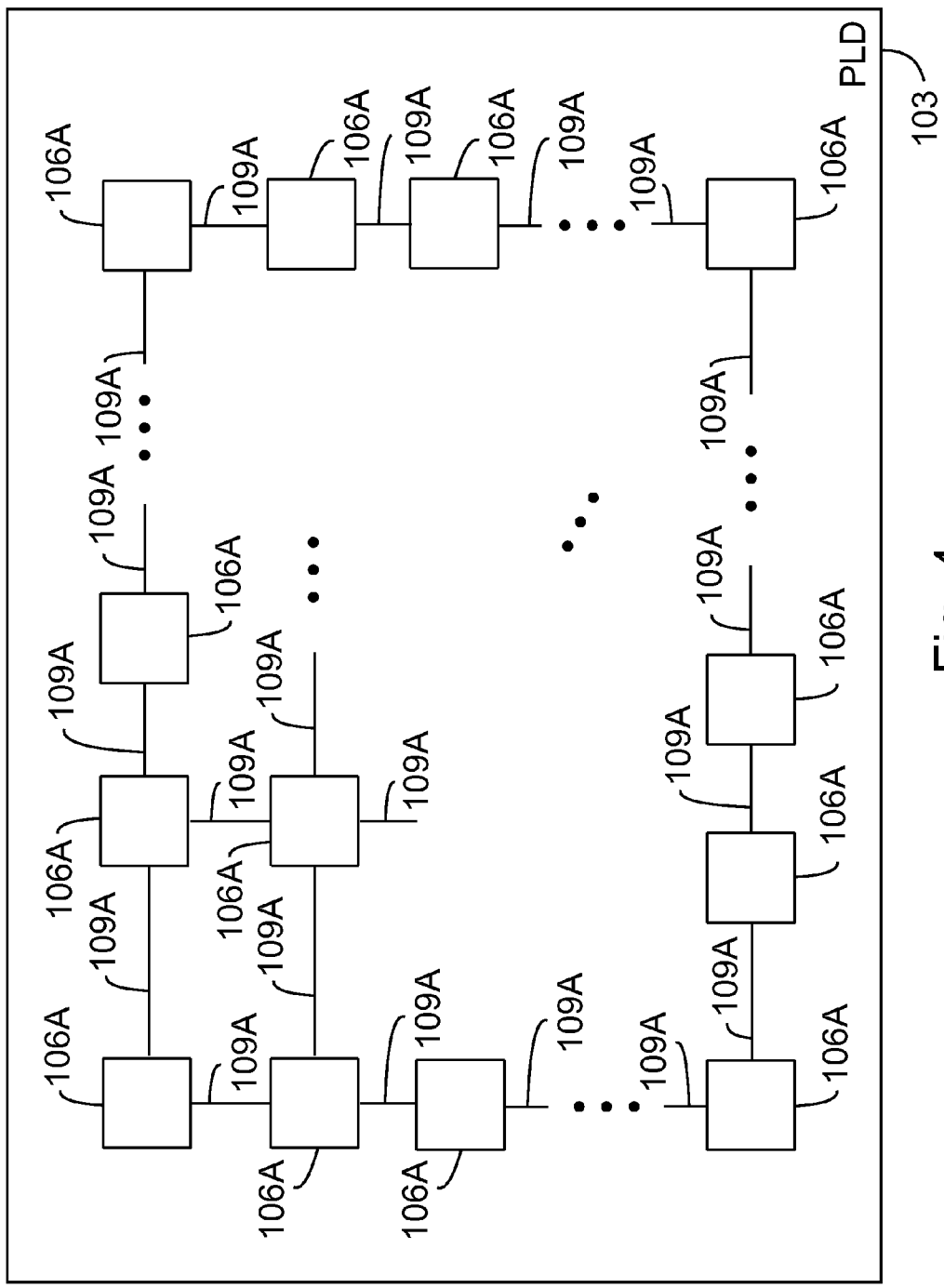
FIG. 4 shows a conceptual, simplified block diagram of programmable logic and programmable interconnect in a PLD according to an exemplary embodiment of the invention.

FIG. 4 shows a conceptual, simplified block diagram of programmable logic 106A and programmable interconnect 109A in a PLD according to an exemplary embodiment of the invention. PLD 103 includes programmable logic 106A arranged as a two-dimensional array. Programmable interconnect 109A, arranged as horizontal interconnect and vertical interconnect, couples the blocks of programmable logic 106A to one another. With a given or desired level of granularity, one may adjust the power supply voltage, threshold voltage, and/or body bias of the transistors and various resources or blocks in PLD 103, as desired, and as illustrated in the examples described below.

In illustrative embodiments, PLDs according to the invention may have a hierarchical architecture. In other words, each block of programmable logic 106 may in turn include smaller or more granular programmable logic blocks or circuits. For example, in one embodiment, programmable logic 106 may constitute blocks of configurable logic named logic array block (LAB), and each LAB may include logic elements (LEs) or other circuitry, as desired. Persons of ordinary skill in the art who have the benefit of the description of the invention understand, however, that a wide variety of other arrangements, with varying terminology and topology, are possible, and fall within the scope of the inventive concepts.

As noted, one may apply desired power management parameters (threshold voltage, body bias, and/or supply voltage) at a desired or suitable level of granularity, for example, with a per-LAB, per multi-LAB, or per-LE granularity level, as desired. The structure and level of utilization of typical PLDs makes possible power versus performance tradeoffs with a relatively high degree of flexibility.

More specifically, a given design typically uses or has a relatively amount of speed-critical circuitry. In other words, a relatively small percentage of the logic circuitry in a typical design is speed-critical. For example, according to one rule of thumb, about 15% of the logic circuitry in a typical design is speed critical. Accordingly, the remaining 85% of the logic circuitry is not speed-critical. Owing to a number of factors, such as the optimality of implementation, for designs implemented using a PLD, the speed-critical percentage might fall even below the 15% figure.

As a result, one may specify a certain percentage of the PLD's resources, for example, LABs or other blocks of programmable circuitry, to have a slower or relatively slow speed of operation and, thus, less leakage and less power consumption. Given that typically less than 15% of the logic circuitry is speed critical, one may reasonably make 50% or 60% of the PLD's resources (e.g., LABs) to have slower speed or relatively slow speed.

Note that, by inter-mixing the various speed grades of the PLD's resources, one may still have sufficient flexibility to implement a design. The PLD CAD software, described above, can appropriately place and route the design to assign speed-critical parts of the circuit to PLD resources with relatively higher (or normal) speeds of operation, and the non-speed-critical parts to slower or relatively slow resources within the PLD.

Another factor also helps to facilitate the CAD's task of placing and routing such a design. More specifically, a typical design tends to not use all of the resources of a PLD. It is not uncommon for designs to use about 30% of the programmable logic of a PLD, and the average rate of utilization might be around 75% (i.e., 25% of the PLD's resources unused). This attribute of PLD implementation and utilization makes it easier for the PLD CAD software to assign speed-critical parts of the design to normal-speed PLD resources, and to assign non-speed-critical parts of the design to slower-speed or relatively slow PLD resources.

Figure 5:
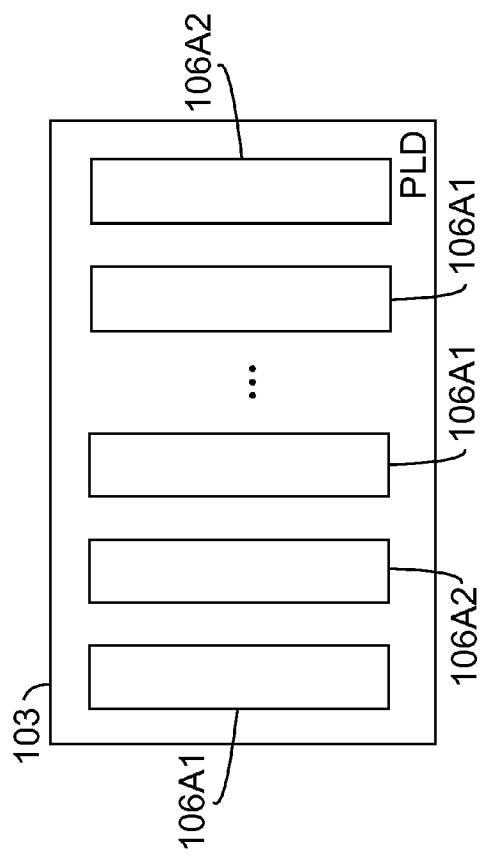
FIG. 5 illustrates distribution of programmable resources in a PLD according to an exemplary embodiment of the invention.

One may include different grades and patterns of PLD resources, having various speed and performance characteristics. For example, in one exemplary embodiment, one may alternate columns of resources (e.g., LABs) of differing or varying speed grades. FIG. 5 shows such a situation. More specifically, columns of programmable logic 106A1, with one speed grade (e.g., normal or relatively high speed), alternate with columns of programmable logic 106A2, with another speed grade (e.g., slower or relatively slow speed). One may use a variety of speed-grade distributions and types, as persons of ordinary skill in the art who have the benefit of the description of the invention understand.

Figure 6:
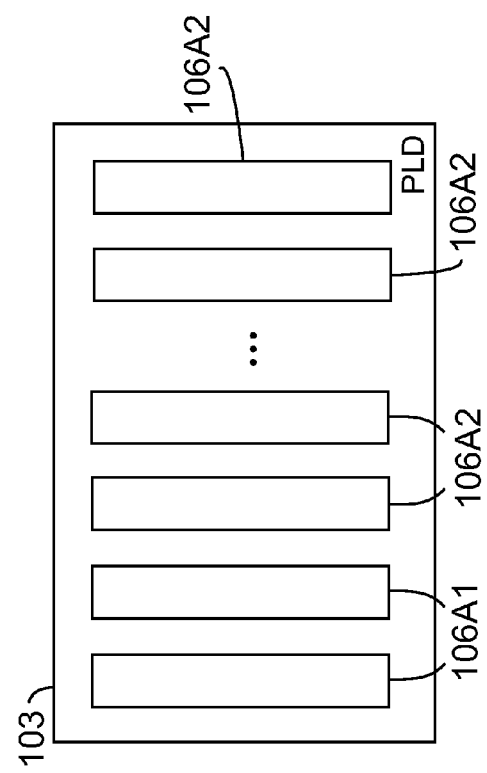
FIG. 6 depicts distribution of programmable resources in a PLD according to another exemplary embodiment of the invention.

As another example, one may use alternating or varying groups of columns of resources (e.g., LABs) with differing or varying speed grades. For example, FIG. 6 shows a PLD that has groups of columns of programmable logic 106A1, with one speed grade (e.g., normal or relatively high speed), and groups of columns of programmable logic 106A2, with another speed grade (e.g., slower or relatively slow speed). Again, note that the embodiment shown provides merely one example of a large set of variations.

Generally, one may use a variety of speed-grade distributions and types, as persons of ordinary skill in the art who have the benefit of the description of the invention understand. For example, one may use different numbers and types of resources in one group versus other groups, as desired. By using the different types of resources and various distribution configurations, one may provide a desired mix of resources. For instance, one may achieve an overall percentage of one or more speed grades of PLD resources (e.g., 15% normal, 85% slower).

Note further that, rather than grouping columns of resources, one may use a wide variety of other configurations, as desired. For example, one may group resources in rows, rather than columns. As another example, one may use other two-dimensional patterns, such as a checker-board pattern, or irregular patterns. Generally, one may arrange the resources of corresponding characteristics (speed, power consumption) in any desired pattern.

Figure 7:
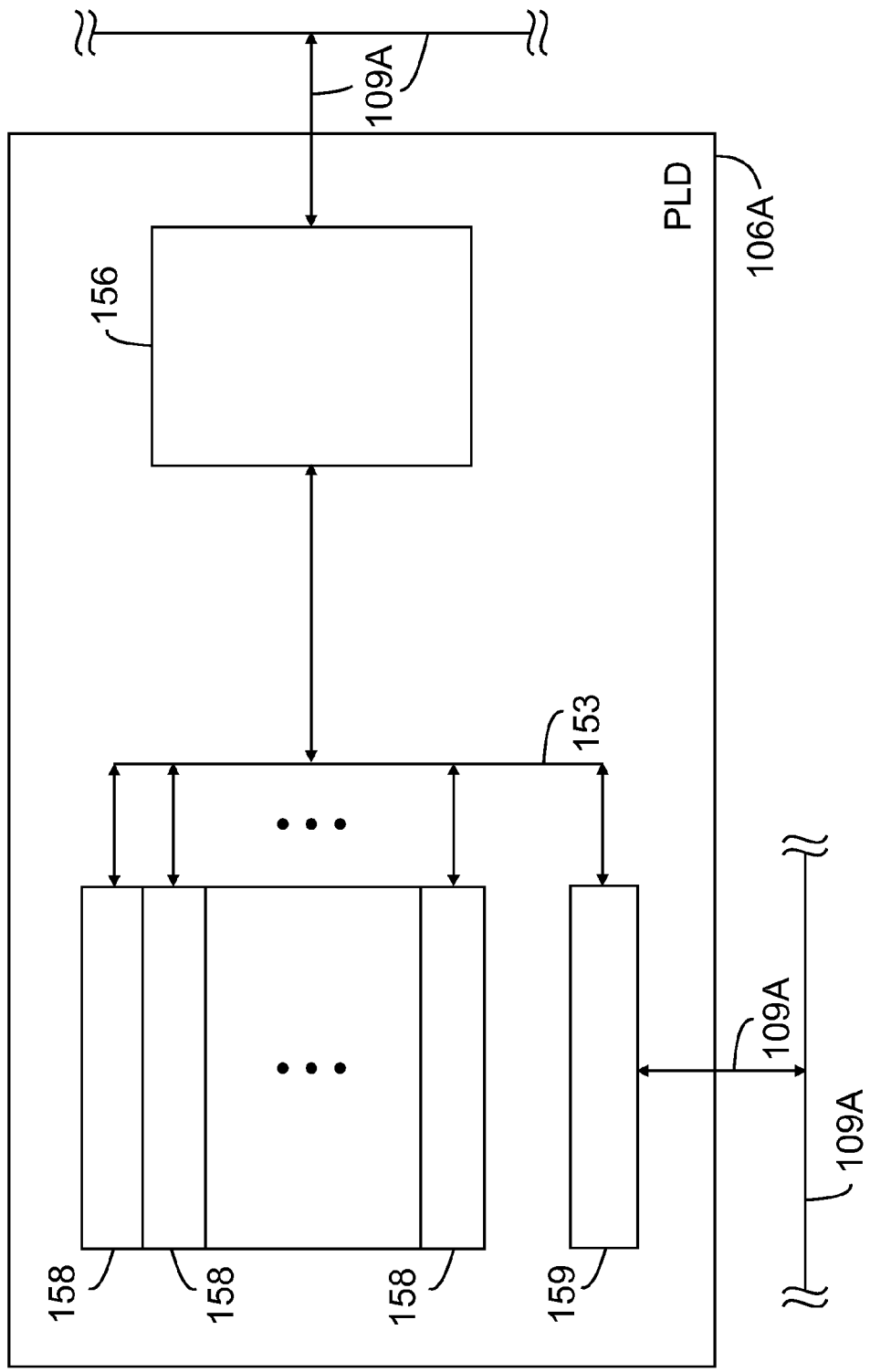
FIG. 7 shows a conceptual block diagram of hierarchical programmable logic in a PLD according to an exemplary embodiment of the invention.

One may apply the power management techniques on finer levels of granularity, as desired. As noted above, PLDs according to exemplary embodiments have a hierarchical architecture. A resource block (e.g., LAB) 106A may, for instance, include smaller blocks of programmable logic circuitry, as FIG. 7 illustrates. More specifically, programmable logic 106A includes logic elements or programmable logic circuits or blocks 158, local interconnect 253, interface circuit 156, and interface circuit 159.

Logic elements 158 provide configurable or programmable logic functions, for example, LUTs, registers, product-term logic, etc., as persons of ordinary skill in the art who have the benefit of the description of the invention understand. Local interconnect 153 provides a configurable or programmable mechanism for logic elements 158 to couple to one another or to programmable interconnect 109 (sometimes called "global interconnect"), as desired.

Interface circuit 156 and interface circuit 159 provide a configurable or programmable way for programmable logic 106A block of circuitry to couple to programmable interconnect 109 (and hence to other programmable logic 106, as FIG. 3 shows). Interface circuit 156 and interface circuit 159 may include MUXs, registers, buffers, drivers, and the like, as persons of ordinary skill in the art who have the benefit of the description of the invention understand.

Similar to the techniques described with respect to FIGS. 4-6, one may use a wide variety of speed and type distributions of logic elements 158, as desired. The particular choice for a given design depends on a number of factors, such as the design and performance specifications, the number and type of resources available, etc., as persons of ordinary skill in the art who have the benefit of the description of the invention understand. Note that, to achieve finer granularity, one may apply the power management techniques to circuitry within logic elements 158, as desired. For example, one may apply the techniques to transistor or groups of transistors, as desired.

Generally speaking, one may provide a suitable or desired distribution and configuration of the various types/grades of logic elements 158 (or circuitry within them) to achieve a certain percentage (and placement or distribution) of speed grades. Furthermore, one may use the distribution and configuration of logic elements 158 of various characteristics (speed, power consumption) to provide higher-level programmable logic blocks 106A having desired speed and power consumption characteristics.

Conversely, one may apply the may apply the power management techniques on coarser levels of granularity, as desired. In some embodiments, one may apply the techniques to groups of blocks of circuitry that include programmable logic (e.g., groups of LABs). For example, one may form a group of 4 normal-speed LABs, or a group of 6 slower-speed LABs, etc. Generally speaking, one may use a mixture of resources of varying types in order to achieve overall percentages of resources with given characteristics (e.g., 20% normal speed, 80% slower speed).

Figure 9:
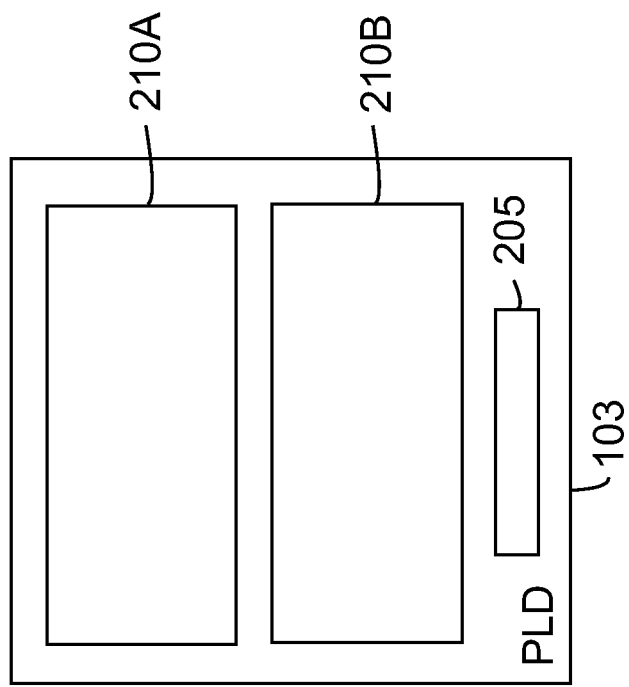
FIGS. 8-9 illustrate distribution of programmable resources in a PLD according to additional exemplary embodiment of the invention.
Figure 8:
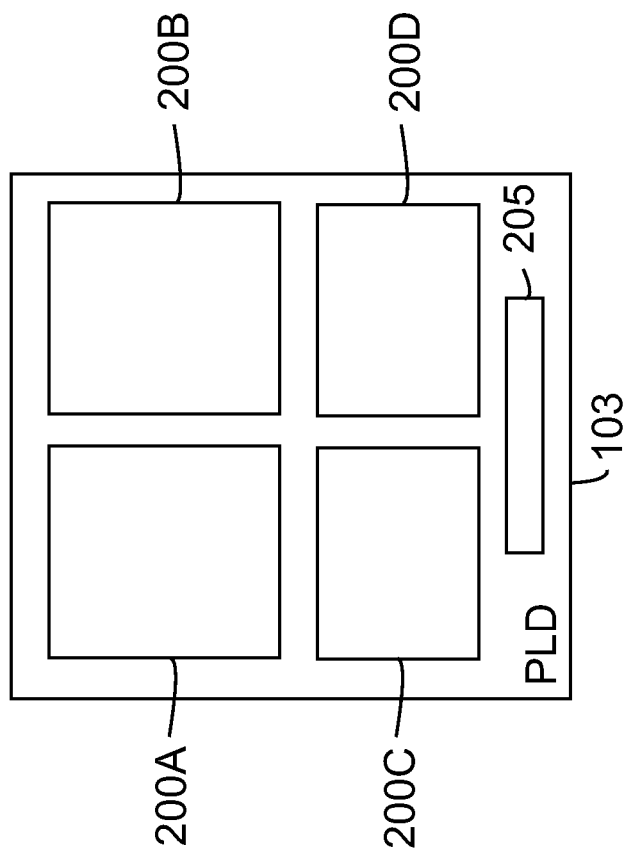

In other embodiments, one may apply the techniques to regions or portions of the PLD fabric (programmable logic and/or interconnect), as desired. For example, FIG. 8 illustrates a situation where one applies the power management techniques differently (e.g., a different fixed threshold voltage, body bias, and/or supply voltage) for each of (or groups of) quadrants 200A-200D of the PLD that have desired or specified types, distributions, or configurations of programmable circuitry or resources (block 205 denotes miscellaneous PLD circuitry not included in quadrants 200A-200D). As another example, FIG. 9 depicts a situation where one applies the techniques differently (e.g., a different fixed threshold voltage, body bias, and/or supply voltage) to halves 210A-210B of the PLD's fabric. Note that the above examples merely help to illustrate the inventive techniques. Other variations are possible, as persons of ordinary skill in the art who have the benefit of the description of the invention understand.

Note that as the size of the regions increases, depending on the particular characteristics of the design, it becomes more difficult for the PLD CAD software to place speed-critical circuitry within the regions or blocks of proper characteristics. Thus, in such embodiments, the software may tend to partition the design into larger functional blocks that get assigned to slower-speed (versus normal or higher-speed) regions, rather than attempt to assign the appropriate speed at the resource block level (e.g., LAB or LE). In such a situation, the user may also provide input so as to implement the PLD floor-planning to place speed-critical circuitry in appropriate regions (e.g., normal-speed regions).

Regardless of the particular level of granularity, as noted above, one may apply various power management attributes, i.e., threshold voltage, body bias, and supply voltage. As described above, the threshold voltage depends on various parameters of the fabrication process, such as doping levels, and the like. Thus, one selects appropriate parameters so as to achieve desired threshold voltages for the circuitry in various regions or blocks of the PLD.

For example, to implement slower or relatively-slow regions, blocks, or circuitry, one may implant the transistors' channels with higher dosages in order to achieve higher threshold voltages. Conversely, for lower threshold voltages (e.g., for transistors corresponding to normal or higher-speed regions, blocks, or circuits), one would use a lower dosage.

Note that one may apply threshold voltage variations (e.g., different fixed body bias values) to both NMOS and PMOS transistors, or to one type or the other, as desired. Furthermore, the variations might apply to some or all of the transistors in each of the two NMOS and PMOS groups, as desired. As an example, a subset of the transistors might have implants corresponding to normal-speed threshold voltages, whereas a majority of the transistors may have implants that correspond to slower-speed threshold voltages. Generally speaking, one fixes the body bias value for desired regions, blocks, or circuits to a specified, desired, or prescribed speed-leakage point. Note that on-chip body bias generators 305 might still vary the body bias value(s) they generate to account for process variations, rather than variable control by the user or software.

Figure 10:
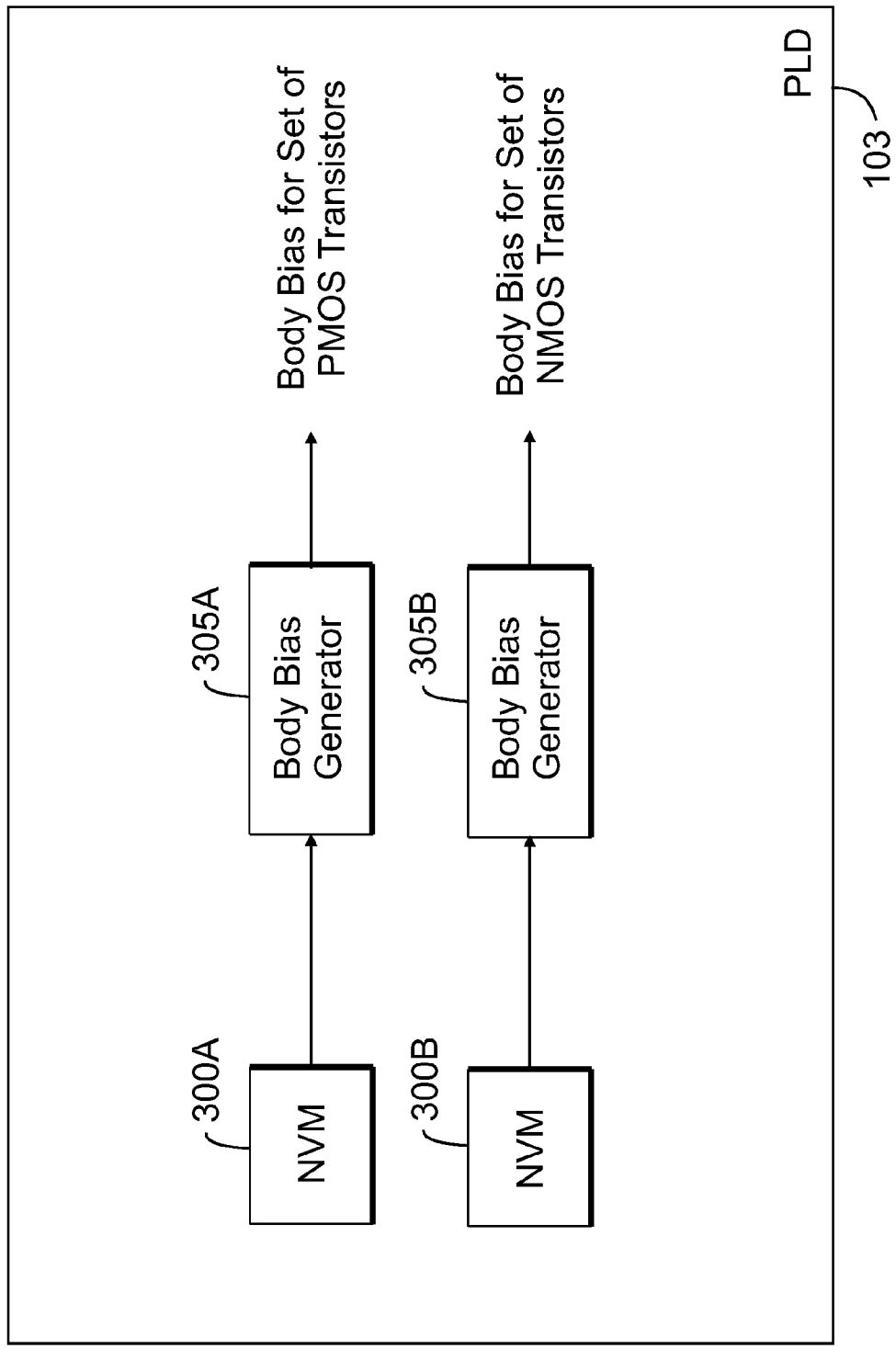
FIG. 10 shows an exemplary embodiment of a circuit arrangement for generating body bias voltages for use in PLDs according to the invention.

With respect to body bias values, one may use a variety of configurations and circuit arrangements, as desired. FIG. 10 shows an exemplary embodiment of a circuit arrangement for generating body bias voltages for use in PLDs according to the invention. The circuit arrangement includes non-volatile memory (NVM) 300A and 300B, and body bias generators 305A and 305B.

NVM 300A-300B provide encoded values, respectively, to body bias generators 305A and 305B. Based on those values, each of generators 305A-305B provides one or more body bias voltages. In the example shown, generator 305A generates body bias voltage(s) for a set (ranging from one to all) of PMOS transistors. Similarly, generator 305B generates body bias voltage(s) for a set (ranging from one to all) of NMOS transistors.

Note that the circuit arrangement in FIG. 10 constitutes an exemplary circuit, and many variations of it are possible, as persons of ordinary skill in the art who have the benefit of the description of the invention understand. For example, rather than using NVM 300A-300B, one may use I/O pads to receive encoded values to provide to generators 305A-305B. As another example, one may use a number of generators to provide a desired number of body bias voltages in a flexible manner, as desired.

Note that one may apply body bias variations to both NMOS and PMOS transistors, or to one type or the other, as desired. Furthermore, the variations might apply to some or all of the transistors in each of the two NMOS and PMOS groups, as desired. As an example, a subset of the transistors might have body bias corresponding to normal-speed threshold voltages, whereas a majority of the transistors may have body bias values that correspond to slower-speed threshold voltages.

Figure 11:
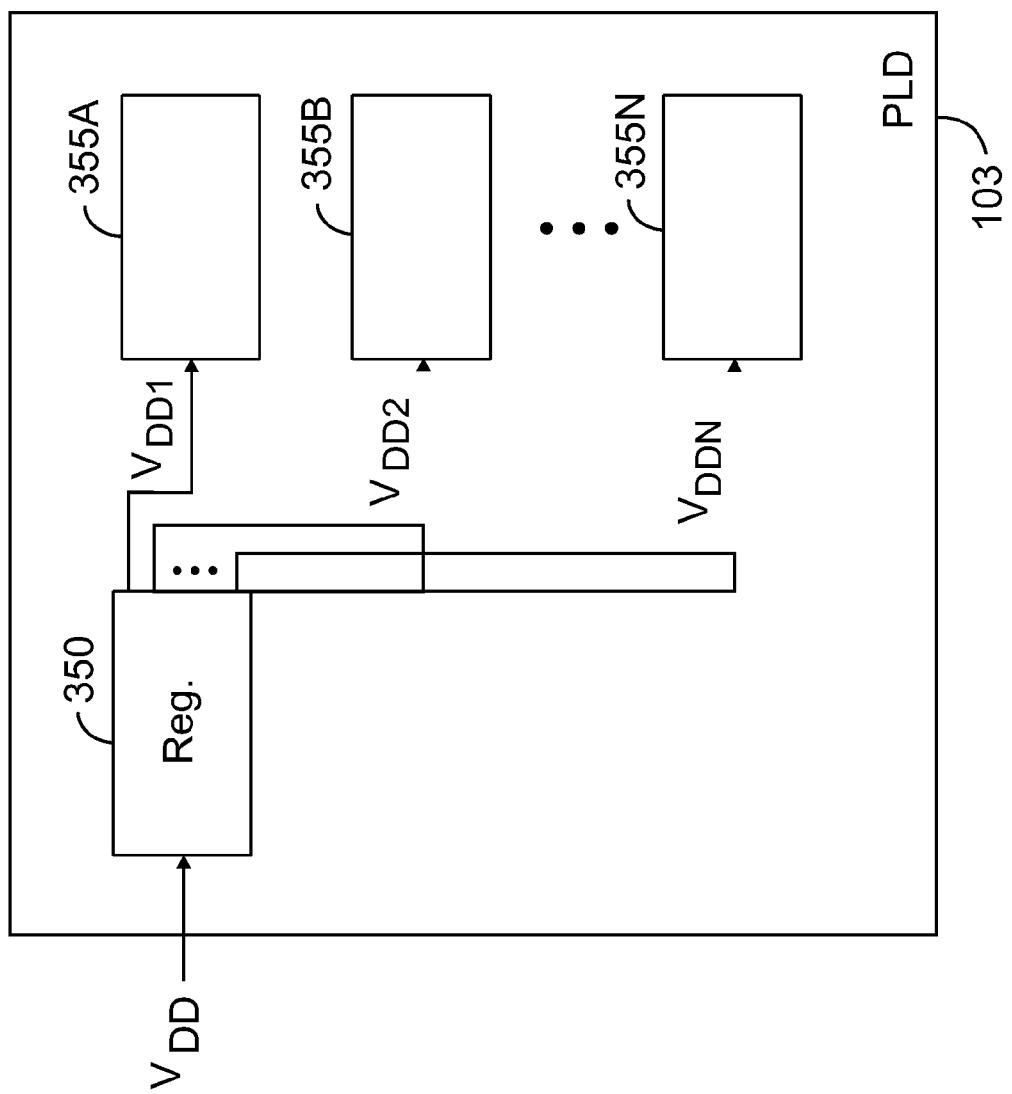
FIG. 11 illustrates one exemplary embodiment for providing supply voltages in PLDs according to the invention.
Figure 12:
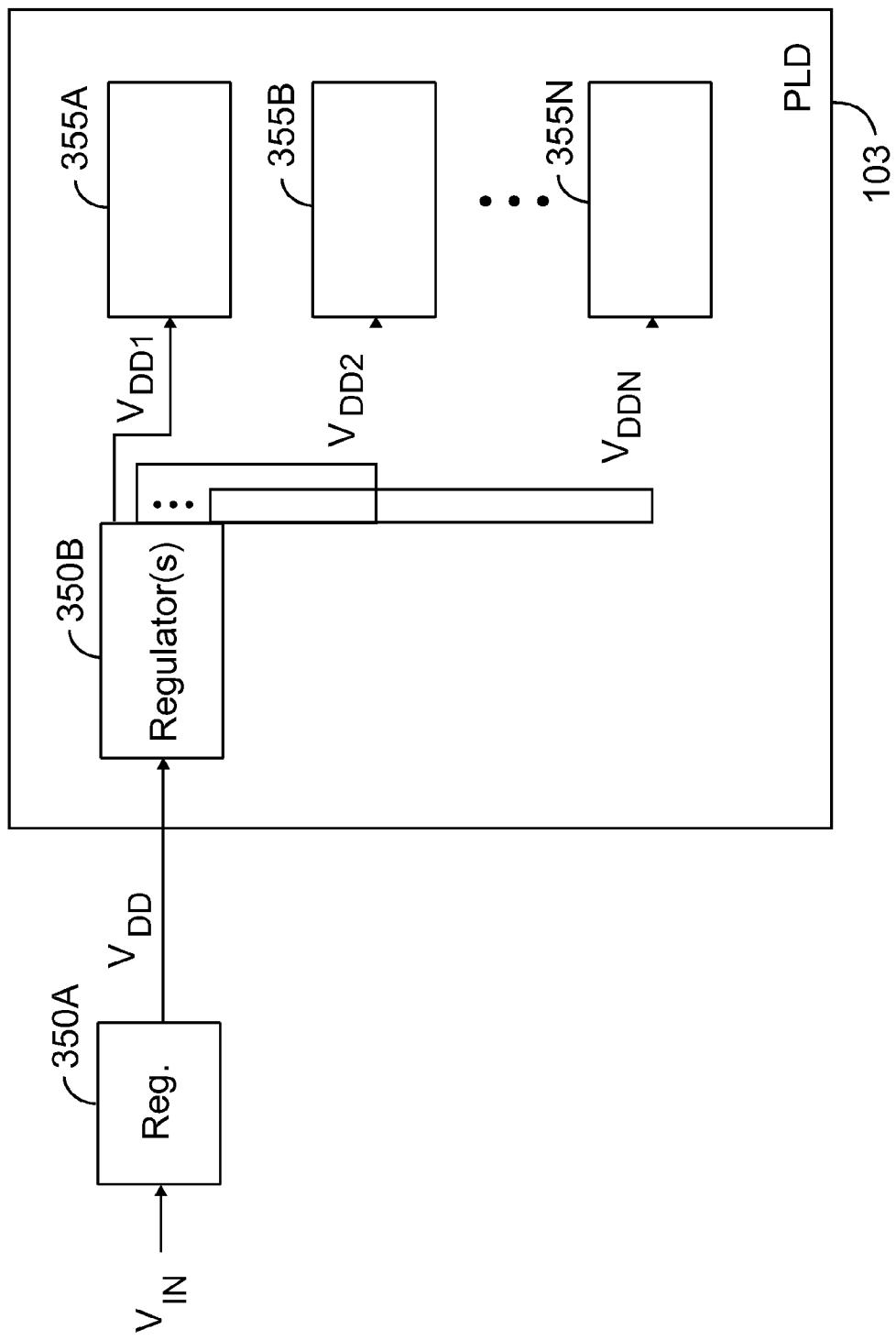
FIG. 12 depicts another exemplary embodiment for providing supply voltages in PLDs according to the invention.

With respect to supply voltages, one may use a wide variety of circuit arrangements. FIGS. 11-12 show exemplary embodiments. In the circuit arrangement of FIG. 11, a regulator 350 accepts a supply voltage ($V_{DD}$), and provides as outputs a plurality of supply voltages ($V_{DD1}$, $V_{DD2}$, . . . , $V_{DDN}$) to PLD circuits 355A-355N, respectively. PLD circuits 355A-355N may constitute any PLD resource, circuit, or block, as described above (e.g., LAB, LE, groups of resources such as LABs or LEs, one or more transistors, groups of transistors of different types, etc.).

By varying the supply voltage provided to each resource, one may fix or configure its speed and power consumption. Thus, by providing a lower supply voltage, one would make the corresponding resources slower-speed or relatively slow (but with lower or relatively low power consumption). Conversely, by providing a higher supply voltage, one would make the corresponding resources normal-speed or relatively fast (but with higher or relatively high power consumption).

In the embodiment of FIG. 12, one uses an external regulator 350A to accept an input voltage ($V_{IN}$) and provide supply voltage ($V_{DD}$) to PLD 103. On-chip regulator(s) 350 then derive a plurality of supply voltages from $V_{DD}$, as described above. Note that, as desired, one may use off-chip regulator(s), and provide a plurality of supply voltages ($V_{DD1}$, $V_{DD2}$, . . . , $V_{DDN}$) to the various PLD resources (355A-355N) via PLD pads, as desired.

Figure 13:
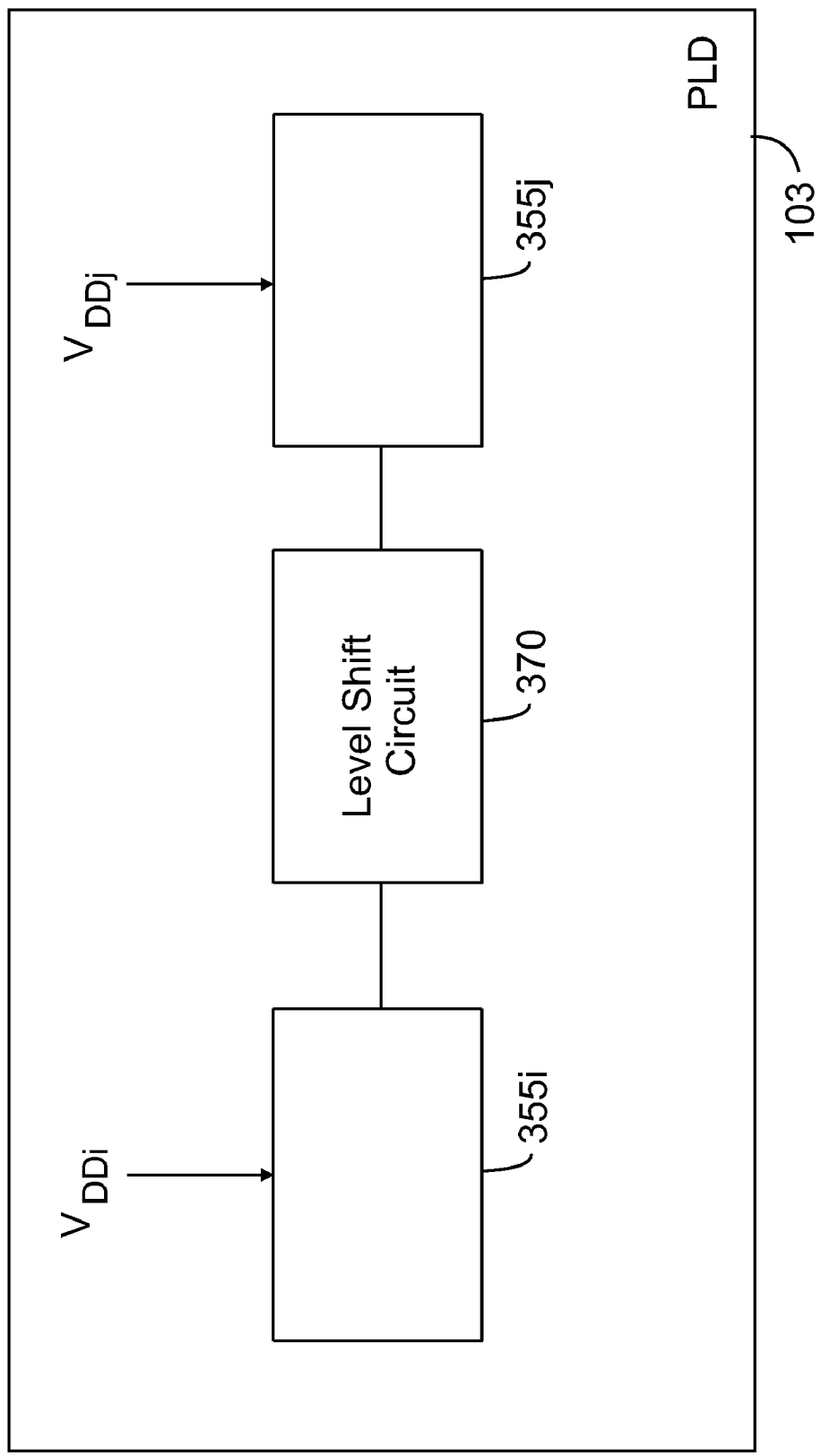
FIG. 13 shows a circuit arrangement including a level-shifter circuit for use in PLDs according to exemplary embodiments of the invention.

In some instances, using a level shifter circuit might be desirable when coupling circuits that receive their power from differing supply voltages or have different speed grades. FIG. 13 shows a circuit arrangement that includes level-shifter circuit 370 to interface PLD region 355*i* to PLD region 355*j*. Generally, not all transistors (or sub-blocks) within a given region or block necessarily have the same supply voltage. For example, a subset of the transistors in a region might constitute normal-speed transistors, whereas other transistors in that region might constitute slower-speed transistors.

In such a situation, an output voltage of one region or circuit (say, 355*i*) might not be suitable for driving an input of another region or circuit (say, 355*j*). Level-shifter circuit 370 shifts the output voltage of circuit 355*i* to make it appropriate for driving the input of circuit 355*j*. Note that level-shifter circuit 370 may have a variety of forms and topologies, as persons of ordinary skill in the art who have the benefit of the description of the invention understand and know.

Figure 14:
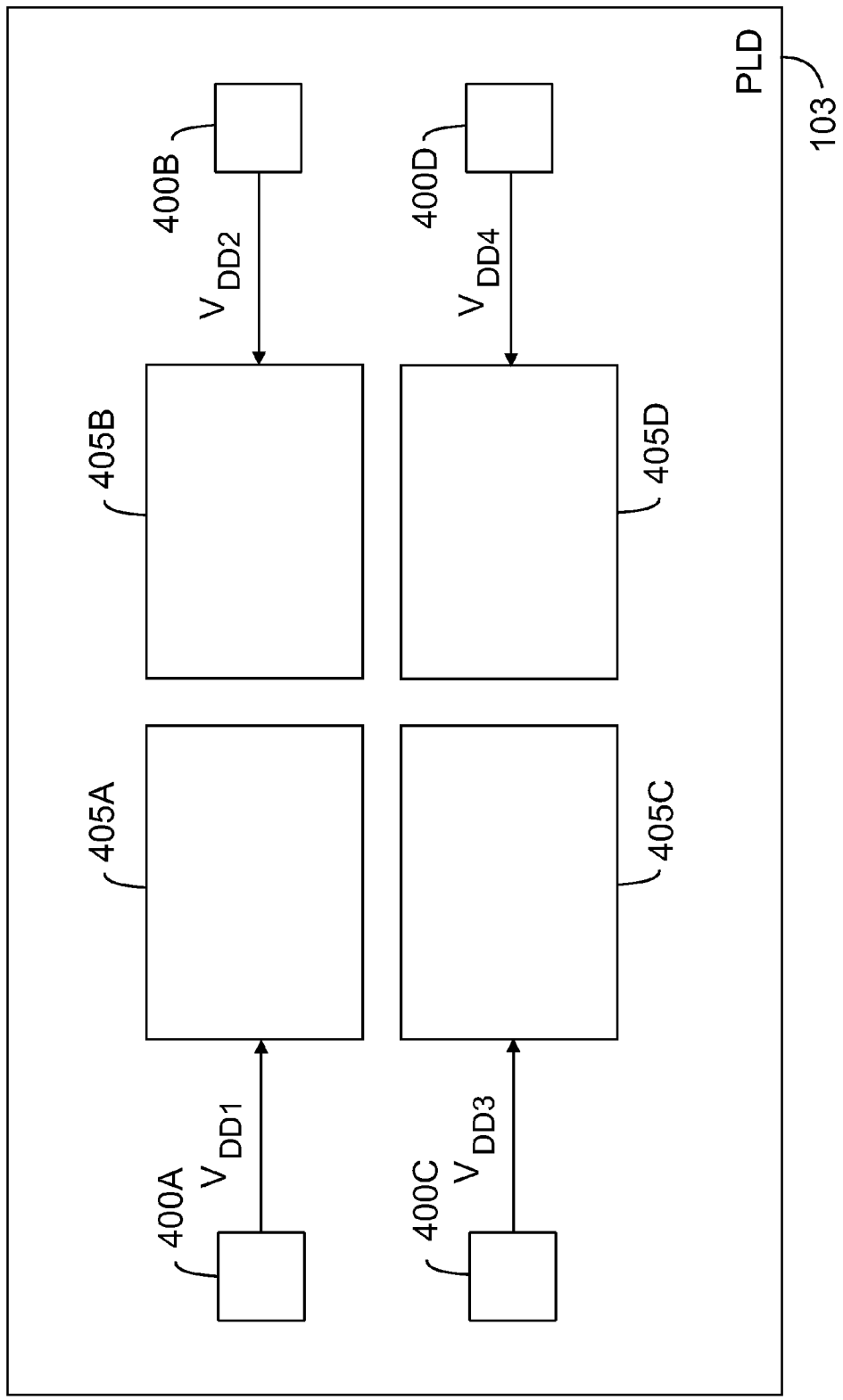
FIG. 14 illustrates an arrangement for flexible application of supply voltages in PLDs according to exemplary embodiments of the invention.

As noted above, one may use the PLD's package to provide power to various regions, circuits, or blocks of PLD 103 in a desired manner. FIG. 14 illustrates an arrangement for flexible application of supply voltages in PLDs according to exemplary embodiments of the invention. A number of solder bumps 400A-400D (or pins, wire-bond pads, leads, etc. depending on the particular type of PLD package used) couple to the supply inputs of PLD circuits 405A-405D. PLD circuits 405A-405D may constitute a variety of blocks, regions, or circuits in PLD 103, for example, each a quadrant of PLD 103 in the embodiment shown.

By using bumps 400A-400D, one may supply power to circuits 405A-405D in a flexible manner, thus providing blocks, circuits, or regions of fixed supply voltage within PLD 103. For example, suppose that the user wants to supply circuits 405A-405D with the same voltage. In this case, one would couple bumps 400A-400D to one another, and to the supply voltage. Thus, in the case of circuits 405A-405D constituting PLD quadrants, from the user's point of view, all four quadrants would have the same supply voltage (and hence the same speed, all other things being equal).

As another example, suppose that the user wishes to supply circuits 405A-405B with one voltage, and circuits 405C-405D with another voltage. In this situation, one would couple bumps 400A-400B to one another and to the first supply voltage. Similarly, one would couple bumps 400C-400D to one another and to the second supply voltage. Thus, in the case of circuits 405A-405D constituting PLD quadrants, from the user's point of view, half of the PLD 103 would have the first supply voltage (and hence the same speed, all other things being equal), and the other half of PLD 103 would have the second supply voltage (and hence the same speed, all other things being equal).

As yet another example, the user might drive any subset of one or more circuits 405A-405D with a distinct supply voltage. For greatest flexibility, the user might supply power to each of circuits 405A-405D from a distinct supply voltage. In this situation, the user might apply $V_{DDA}$ to bump 400A, $V_{DDB}$ to bump 400B, and so on. Thus, in the case of circuits 405A-405D constituting PLD quadrants, from the user's point of view, each of the four quadrants would have a unique supply voltage (and hence a correspondingly unique speed, all other things being equal).

Note that using the bump configuration provides the user supply voltage flexibility and variability within the same die-package combination. Furthermore, rather than using four bumps and circuits, one may use a variety of other configurations (e.g., different number of bumps, different number of circuits, or both), as desired, and as persons of ordinary skill in the art who have the benefit of the description of the invention understand.

Figure 15:
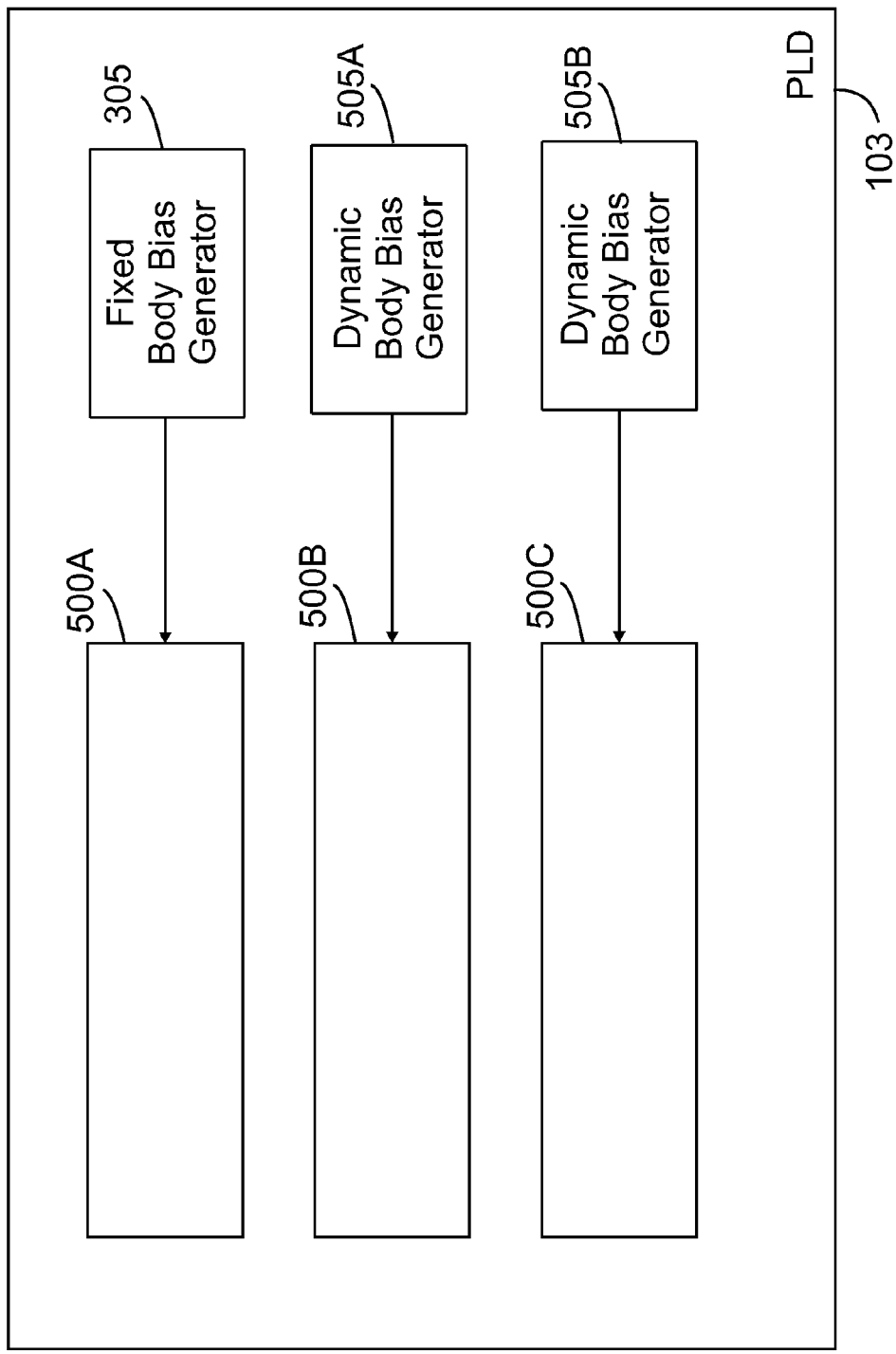
FIG. 15 depicts a circuit arrangement for using hard and soft regions or blocks or circuits in PLDs according to exemplary embodiments of the invention.

Rather than using fixed (hard-implemented) regions, one may use a combination of fixed and non-fixed (soft-implemented) regions, as desired. FIG. 15 depicts a circuit arrangement for using hard- and soft-implemented regions or blocks or circuits in PLDs according to exemplary embodiments of the invention. The circuit arrangement includes fixed body-bias generator 305, which provides body bias voltage(s) to PLD block, circuit, or region 500A, as described above. The body bias voltages may result in region 500A being a relatively slow, slower, normal speed, or relatively high speed (or other speed grade) region of PLD 103, as desired.

The circuit arrangement further includes dynamic body-bias generators 505A-505B that in turn provide body bias voltages to regions 500B and 500C, respectively. Generators 505A-505B provide body bias voltages whose values may generally depend on a number of parameters and may vary dynamically as a function of time or other variables. The parameters may include temperature of one or more parts or circuits of PLD 103, the attainment of one or more performance criteria (e.g., speed of operation, etc.), as described in commonly assigned U.S. patent application Ser. No. 10/865,402, titled "Apparatus and Methods for Adjusting Performance of Integrated Circuits," filed on Jun. 10, 2004.

The body bias voltage(s) generated by each of generators 505A-505B may result in the corresponding one of regions 500B-500C being a relatively slow, slower, normal speed, or relatively high speed (or other speed grade) region of PLD 103, as desired. By mixing and configuring the speed grades (and corresponding power consumption) characteristics of regions 500A-500C, one may provide to the user a PLD with a flexible mechanism for performance-power consumption tradeoff, depending on factors such as design and performance specifications, the user's needs, etc.

Figure 16:
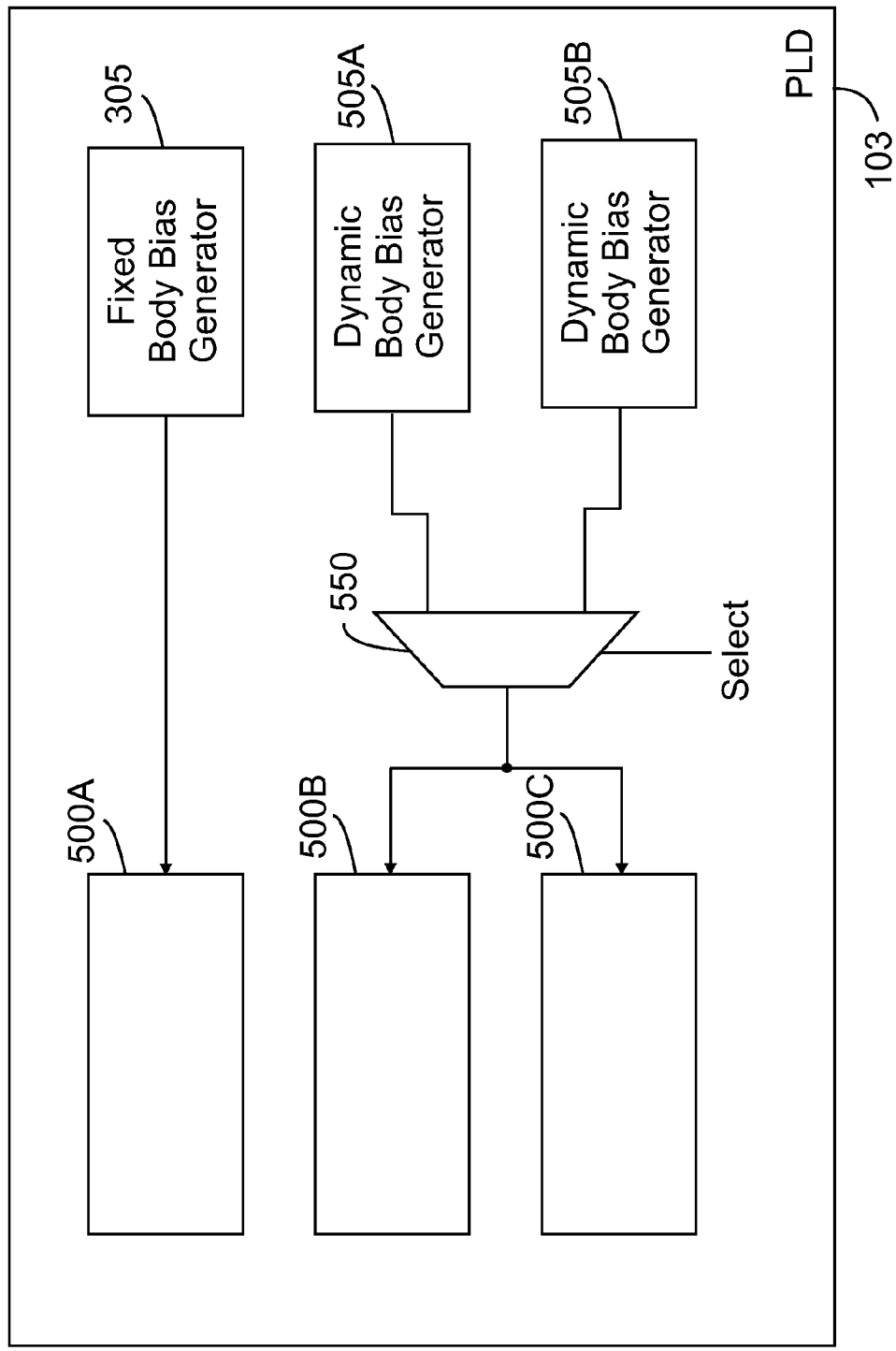
FIG. 16 shows another circuit arrangement for using hard and soft regions or blocks or circuits in PLDs according to exemplary embodiments of the invention.

FIG. 16 shows another circuit arrangement for using hard- and soft-implemented regions or blocks or circuits in PLDs according to exemplary embodiments of the invention. The blocks in FIG. 16 are similar to, and perform similar functions, as the corresponding blocks in FIG. 15. Regions 500B-500C may couple (via multiplexer 550, driven by the user or the CAD software (e.g., through configuration memory 133) through the Select signal, or via hard-wired coupling mechanisms, as desired) to either of dynamic body bias generator 505A and dynamic body bias generator 505B to receive body bias voltage(s). Region 500A, on the other hand, receives fixed body bias voltage(s) from fixed body bias generator 305.

Note that, rather than slower-speed and normal-speed regions, one may generally use the inventive techniques to provide any combination of speed grades, as desired, and as persons of ordinary skill in the art who have the benefit of the description of the invention understand. Some examples include very slow-speed regions, slow-speed regions, relatively slow regions, normal-speed regions, relatively fast regions, high-speed regions, or very high-speed regions. One may have hard- or soft-implemented regions with any set of such speed grades, as desired.

Furthermore, one may apply the inventive concepts effectively to various ICs, including those that include programmable or configurable logic circuitry, which may be known by other names in the art, as desired, and as persons skilled in the art with the benefit of the description of the invention understand. Such circuitry include, for example, devices known as complex programmable logic device (CPLD), programmable gate array (PGA), and field programmable gate array (FPGA).

Referring to the figures, persons of ordinary skill in the art will note that the various blocks shown may depict mainly the conceptual functions and signal flow. The actual circuit implementation may or may not contain separately identifiable hardware for the various functional blocks and may or may not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art who have the benefit of the description of the invention understand. Other modifications and alternative embodiments of the invention in addition to those described here will be apparent to persons of ordinary skill in the art who have the benefit of the description of the invention. Accordingly, this description teaches those skilled in the art the manner of carrying out the invention and are to be construed as illustrative only.

The forms of the invention shown and described should be taken as the presently preferred or illustrative embodiments. Persons skilled in the art may make various changes in the shape, size and arrangement of parts without departing from the scope of the invention described in this document. For example, persons skilled in the art may substitute equivalent elements for the elements illustrated and described here. Moreover, persons skilled in the art who have the benefit of this description of the invention may use certain features of the invention independently of the use of other features, without departing from the scope of the invention.

The invention claimed is:

1. A method of designing a programmable logic device (PLD) including programmable circuitry, the method comprising:
    obtaining a set of parameters corresponding to an operating characteristic of the PLD, the set of parameters comprising at least one fixed threshold voltage, at least one fixed body bias voltage, and at least one fixed supply voltage;
    selecting a level of granularity for application of the set of parameters to at least some parts of the programmable circuitry within the PLD; and
    applying the obtained set of parameters to the at least some parts of the programmable circuitry corresponding to the selected level of granularity.

2. The method according to claim 1, wherein the operating characteristic of the PLD comprises a speed of operation of the PLD.

3. The method according to claim 1, wherein selecting a level of granularity for application of the set of parameters to at least some parts of the programmable circuitry within the PLD comprises selecting blocks of programmable logic.

4. The method according to claim 3, wherein the blocks of programmable logic comprise programmable logic circuits with alternating speed grades.

5. The method according to claim 3, wherein the blocks of programmable logic comprise groups of programmable logic circuits with alternating speed grades.

6. The method according to claim 3, wherein the blocks of programmable logic comprise programmable logic circuits arranged in rows.

7. The method according to claim 3, wherein the blocks of programmable logic comprise programmable logic circuits arranged in columns.

8. The method according to claim 3, wherein the blocks of programmable logic comprise programmable logic circuits arranged in a two-dimensional array.

9. The method according to claim 3, wherein the blocks of programmable logic comprise quadrants of the PLD.

10. The method according to claim 3, wherein the blocks of programmable logic comprise halves of the PLD.

11. The method according to claim 3, wherein the blocks of programmable logic comprise logic array blocks (LABs).

12. The method according to claim 3, wherein the blocks of programmable logic comprise logic elements (LEs).

13. The method according to claim 1, wherein selecting a level of granularity for application of the set of parameters to at least some parts of the programmable circuitry within the PLD comprises selecting blocks of programmable interconnect.

14. A system for designing a programmable logic device (PLD) using a computer-aided design (CAD) tool, the system comprising a computer to:

obtain a set of parameters corresponding to an operating characteristic of the PLD, the set of parameters comprising at least one fixed threshold voltage, at least one fixed body bias voltage, and at least one fixed supply voltage;

select a level of granularity for application of the set of parameters to at least some parts of the programmable circuitry within the PLD; and apply the obtained set of parameters to the at least some parts of the programmable circuitry corresponding to the selected level of granularity.

15. The system according to claim 14, wherein the operating characteristic of the PLD comprises a speed of operation of the PLD.

16. The system according to claim 14, wherein selecting a level of granularity for application of the set of parameters to at least some parts of the programmable circuitry within the PLD comprises selecting blocks of programmable logic.

17. The system according to claim 16, wherein the blocks of programmable logic comprise programmable logic circuits with alternating speed grades.

18. The system according to claim 16, wherein the blocks of programmable logic comprise groups of programmable logic circuits with alternating speed grades.

19. The system according to claim 16, wherein the blocks of programmable logic comprise programmable logic circuits arranged in rows.

20. The system according to claim 16, wherein the blocks of programmable logic comprise programmable logic circuits arranged in columns.

* * * * *